(12) United States Patent (10) Patent No.: US 9,257,157 B2
Chu (45) Date of Patent: Feb. 9, 2016

(54) MEMORY STORAGE DEVICE, MEMORY CONTROLLER, AND TEMPERATURE MANAGEMENT METHOD

(75) Inventor: Chien-Hua Chu, Hsinchu County (TW)

(73) Assignee: PHISON ELECTRONICS CORP., Miaoli (TW)

(*) Notice: Subject to any disclaimer, the term of this patent is extended or adjusted under 35 U.S.C. 154(b) by 664 days.

(21) Appl. No.: 13/297,280

(22) Filed: Nov. 16, 2011

(65) Prior Publication Data

US 2013/0080680 A1 Mar. 28, 2013

(30) Foreign Application Priority Data

Sep. 22, 2011 (TW) .............................. 100134174 A

(51) Int. Cl.
*G06F 12/02* (2006.01)
*G11C 7/04* (2006.01)
*G11C 11/406* (2006.01)

(52) U.S. Cl.
CPC .............. *G11C 7/04* (2013.01); *G06F 12/0246* (2013.01); *G11C 11/40615* (2013.01)

(58) Field of Classification Search
None
See application file for complete search history.

(56) References Cited

U.S. PATENT DOCUMENTS

| 6,405,277 | B1* | 6/2002 | Jen et al. ............................ 711/4 |
| 6,548,785 | B1* | 4/2003 | Rius et al. ...................... 219/248 |
| 7,257,684 | B1* | 8/2007 | Sinha et al. .................... 711/154 |
| 7,797,506 | B2* | 9/2010 | Rangarajan ............. G06F 1/206 365/211 |
| 7,849,261 | B2* | 12/2010 | Pherson et al. ................ 711/114 |
| 8,286,111 | B2* | 10/2012 | Chandra et al. ............... 716/110 |
| 2003/0191889 | A1* | 10/2003 | Forrer, Jr. ...................... 711/112 |
| 2006/0221741 | A1* | 10/2006 | Jain et al. ....................... 365/211 |
| 2007/0050569 | A1* | 3/2007 | Haustein et al. .............. 711/154 |
| 2007/0211548 | A1* | 9/2007 | Jain et al. ....................... 365/211 |
| 2008/0005469 | A1* | 1/2008 | Pherson et al. ................ 711/114 |
| 2008/0134191 | A1* | 6/2008 | Warrier et al. ................. 718/104 |
| 2008/0228959 | A1* | 9/2008 | Wang .............................. 710/22 |
| 2008/0270691 | A1* | 10/2008 | Belady .......................... 711/114 |
| 2009/0094406 | A1* | 4/2009 | Ashwood ...................... 711/103 |

(Continued)

FOREIGN PATENT DOCUMENTS

CN 101578614 A 11/2009
CN 101719377 A 6/2010

(Continued)

OTHER PUBLICATIONS

"Office Action of Taiwan Counterpart Application", issued on Nov. 4, 2013, p. 1-p. 11.

(Continued)

*Primary Examiner* — Kevin Verbrugge
(74) *Attorney, Agent, or Firm* — Jianq Chyun IP Office

(57) ABSTRACT

A temperature management method suitable for a memory storage device having a rewritable non-volatile memory module and a memory controller used for controlling the rewritable non-volatile memory module are provided. The temperature management method includes detecting and determining whether the hot-spot temperature of the memory storage device is higher than a predetermined temperature; and when affirmative, making the memory controller execute a cooling process, so as to reduce the hot-spot temperature of the memory storage device. Accordingly, the problem of heat buildup of the (rewritable non-volatile) memory storage device can be mitigated, as well as the problems of data loss and device aging of the (rewritable non-volatile) memory storage device.

18 Claims, 4 Drawing Sheets

(56) References Cited

U.S. PATENT DOCUMENTS

| | | | |
|---|---|---|---|
| 2010/0138682 A1* | 6/2010 | Obana et al. | 711/154 |
| 2011/0161712 A1* | 6/2011 | Athalye et al. | 711/165 |
| 2011/0185224 A1* | 7/2011 | Tsai et al. | 714/6.11 |
| 2011/0219203 A1* | 9/2011 | Nurminen et al. | 711/165 |
| 2012/0089854 A1* | 4/2012 | Breakstone et al. | 711/102 |
| 2012/0102259 A1* | 4/2012 | Goss et al. | 711/103 |
| 2012/0112907 A1* | 5/2012 | Flath | 711/154 |
| 2012/0249218 A1* | 10/2012 | Shoemaker | 327/512 |
| 2013/0285687 A1* | 10/2013 | Chakraborty et al. | 324/750.06 |
| 2013/0290600 A1* | 10/2013 | Tzafrir | 711/103 |
| 2013/0290611 A1* | 10/2013 | Biederman et al. | 711/103 |
| 2014/0101371 A1* | 4/2014 | Nguyen | G06F 3/0616 711/103 |
| 2015/0220278 A1* | 8/2015 | Sarcone | G06F 3/0613 711/103 |

FOREIGN PATENT DOCUMENTS

| | | |
|---|---|---|
| TW | 201009911 | 3/2010 |
| TW | 201030515 | 8/2010 |

OTHER PUBLICATIONS

"Office Action of China Counterpart Application", issued on Feb. 2015, p. 1-p. 16.

* cited by examiner

MEMORY STORAGE DEVICE, MEMORY CONTROLLER, AND TEMPERATURE MANAGEMENT METHOD

CROSS-REFERENCE TO RELATED APPLICATION

This application claims the priority benefit of Taiwan application serial no. 100134174, filed Sep. 22, 2011. The entirety of the above-mentioned patent application is hereby incorporated by reference herein and made a part of this specification.

BACKGROUND OF THE INVENTION

1. Technology Field

The invention relates to a hot-spot temperature management method for a memory storage device, and a memory controller and a memory storage device using the same.

2. Description of Related Art

Along with the rapid growth of digital cameras, cell phones, and MP3 devices in recent years, the consumers' demand for storage media has increased drastically. Rewritable non-volatile memory is one of the most adaptable memories for portable electronic products such as cell phones, personal digital assistant (PDA) devices, and notebook computers due to its characteristics such as data non-volatility, low power consumption, small volume, non-mechanical structure, and high access speed.

Moreover, rewritable non-volatile memory has been broadly used for storing important personal data thanks to its small volume and large storage capacity. Therefore, the rewritable non-volatile memory industry has become a very important part of the electronic industry in recent years. However, as the volume of the rewritable non-volatile memory device becomes smaller and smaller, the heat buildup problem of the rewritable non-volatile memory becomes increasingly significant. If no proper heat dissipation measures are adopted to control the overall temperature of the rewritable non-volatile memory device, the rewritable non-volatile memory device becomes prone to data loss due to the heat buildup, and the memory device ages at a fast pace.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY OF THE INVENTION

Accordingly, the invention is directed to a temperature management method, a memory controller, and a memory storage device for mitigating the problems described above.

An exemplary embodiment of the invention provides a temperature management method suitable for a memory storage device having a rewritable non-volatile memory module and a memory controller used for controlling the rewritable non-volatile memory module. The temperature management method includes detecting and determining whether a hot-spot temperature of the memory storage device is higher than a predetermined temperature; and when affirmative, making the memory controller execute a cooling process, so as to reduce the hot-spot temperature of the memory storage device.

Another exemplary embodiment of the invention provides a memory controller used for controlling a rewritable non-volatile memory module of a memory storage device. The memory controller includes a host interface, a memory interface, and a memory management circuit. The host interface is configured to couple to a host system. The memory interface is configured to couple to the rewritable non-volatile memory module. The memory management circuit is coupled to the host interface and the memory interface, and the memory management circuit is configured to execute a cooling process for reducing the hot-spot temperature of the memory storage device when the hot-spot temperature of the memory storage device is higher than a predetermined temperature.

According to an exemplary embodiment of the invention, the memory controller further includes a buffer memory coupled to the memory management circuit, and the buffer memory configured to temporarily store data from the host system or data from the rewritable non-volatile memory module.

According to an exemplary embodiment of the invention, the buffer memory may be a dynamic random access memory (DRAM).

An exemplary embodiment of the invention provides a memory storage device including a connector, a rewritable non-volatile memory module, a thermal sensor, and a memory controller. The connector is configured to couple to the host system. The thermal sensor is configured to detect the hot-spot temperature of the memory storage device. The memory controller is coupled to the connector, the rewritable non-volatile memory module, and the thermal sensor, and the memory controller is configured to execute a cooling process for reducing the hot-spot temperature of the memory storage device when the hot-spot temperature of the memory storage device is higher than a predetermined temperature.

According to an exemplary embodiment of the invention, the rewritable non-volatile memory module includes a plurality of rewritable non-volatile memory dies. Moreover, the executed cooling process executed includes at least one of the following:

Lower an internal work frequency of the memory controller;

Lower a work frequency for accessing the non-volatile memory module;

Lower a total number of the rewritable non-volatile memory dies being simultaneously accessed;

Lower a total number of rewritable non-volatile memory dies simultaneously in a busy state;

Increase an interval time between control commands issued to the rewritable non-volatile memory module;

Stop issuing a cache program control command and a cache read control command to the rewritable non-volatile memory module; and Enter the buffer memory into a self-refresh mode to suspend a controller controlling the DRAM when all of the rewritable non-volatile memory dies are in a busy state, in which the busy state represents that the rewritable non-volatile memory dies are currently operating.

According to an exemplary embodiment of the invention, lowering the internal work frequency of the memory controller may be implemented in practice by lowering the internal work frequency of the memory controller to a first frequency. When the hot-spot temperature of the memory storage device has not been reduced after the internal work frequency has been lowered to the first frequency for a predetermined time, the work frequency is lowered from the first frequency to a lower second frequency; conversely, the internal work frequency of the memory controller is restored from the first frequency to a higher original frequency.

According to an exemplary embodiment of the invention, lowering the work frequency for accessing the rewritable non-volatile memory module may be implemented in practice by lowering work frequency for accessing the rewritable non-volatile memory module (i.e. an access frequency) to a first frequency. When the hot-spot temperature of the memory storage device has not been reduced after the access frequency has been lowered to the first frequency for a predetermined time, the access frequency is lowered from the first frequency to a lower second frequency; conversely, the access frequency is restored from the first frequency to a higher original frequency.

According to an exemplary embodiment of the invention, lowering the total number of the rewritable non-volatile memory dies being simultaneously accessed may be implemented in practice by lowering the total number of the rewritable non-volatile memory dies being simultaneously accessed (i.e. the total number of dies being simultaneously accessed) to a first number. When the hot-spot temperature of the memory storage device has not been reduced after the total number of dies being simultaneously accessed has been lowered to the first number for a predetermined time, the total number of dies being simultaneously accessed is lowered from the first number to a lower second number; conversely, the total number of dies being simultaneously accessed is restored from the first number to a higher original number or other higher quantities.

According to an exemplary embodiment of the invention, lowering the total number of the rewritable non-volatile memory dies simultaneously in the busy state may be implemented in practice by lowering the total number of the rewritable non-volatile memory simultaneously in the busy state (i.e. the total number of dies simultaneously in the busy state) to a first number. When the hot-spot temperature of the memory storage device has not been reduced after the total number of dies simultaneously in the busy state has been lowered to the first number for a predetermined time, the total number of dies simultaneously in the busy state is lowered from the first number to a lower second number; conversely, the total number of dies simultaneously in the busy state is restored from the first number to a higher original number or other higher quantities.

In summary, according to exemplary embodiments of the invention, when the hot-spot temperature of the memory storage device reaches a predetermined temperature, a plurality/single cooling process/mechanism is executed. Accordingly, the heat buildup problem of the (rewritable non-volatile) memory storage device is mitigated.

It should be understood, however, that this Summary may not contain all of the aspects and embodiments of the invention, that this Summary is not meant to be limiting or restrictive in any manner, and that the invention as disclosed herein is and will be understood by those of ordinary skill in the art to encompass obvious improvements and modifications thereto.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
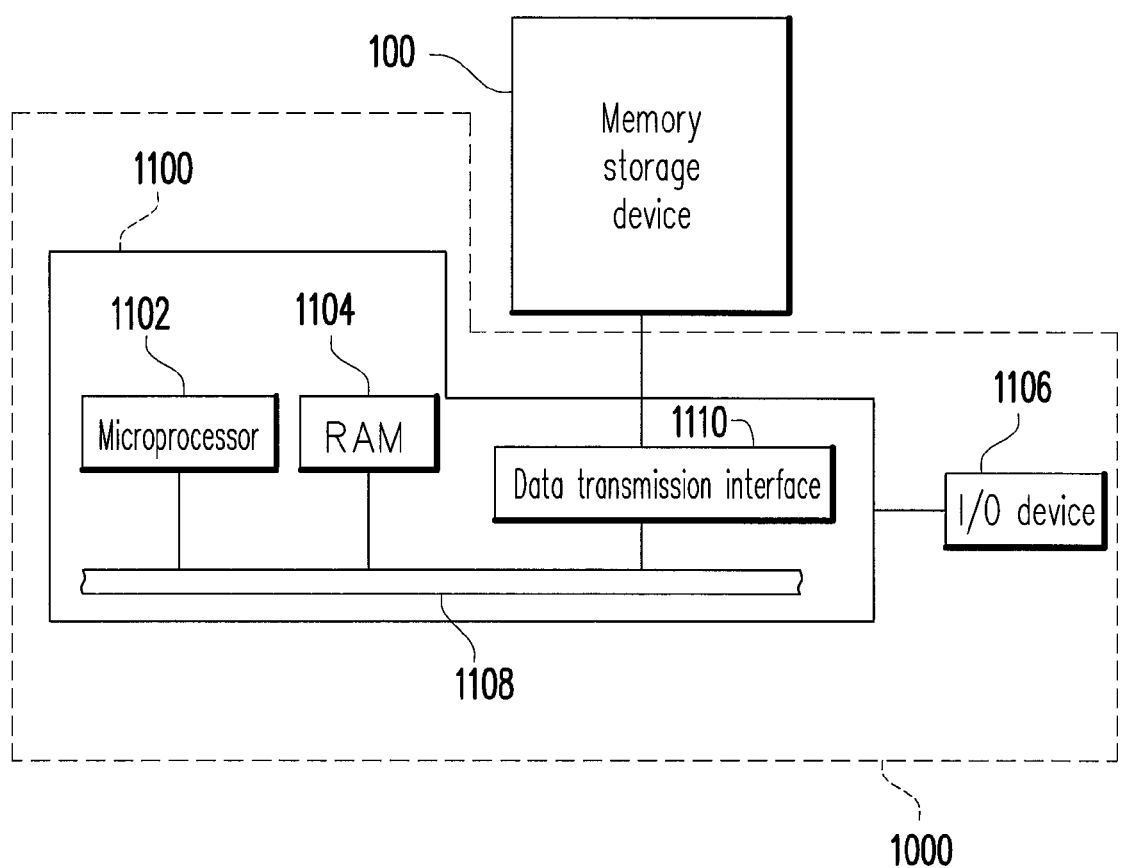
FIG. 1A is a schematic block diagram of a host system using a memory storage device according to an exemplary embodiment of the invention.

References will now be made in detail to the exemplary embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Typically speaking, a memory storage device (i.e. a memory storage system) includes a rewritable non-volatile memory module and a memory controller (i.e. a memory control circuit). The memory storage device is usually used together with a host system so that the host system can write data into or read data from the memory storage device.

FIG. 1A is a schematic block diagram of a host system using a memory storage device according to an exemplary embodiment of the invention.

Figure 1B:
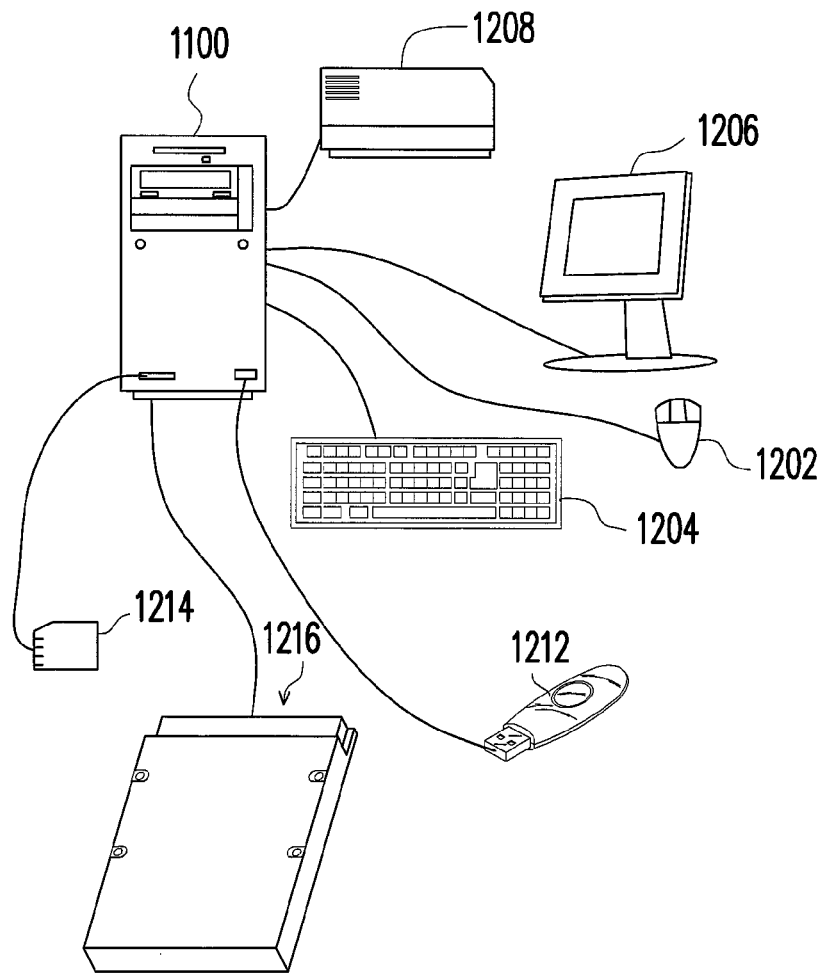
FIG. 1B is a schematic diagram illustrating a computer, an input/output (I/O) device, and a memory storage device according to an exemplary embodiment of the invention.

A host system 1000 includes a computer 1100 and an input/output (I/O) device 1106. The computer 1100 includes a microprocessor 1102, a random access memory (RAM) 1104, a system bus 1108, and a data transmission interface 1110. The I/O device 1106 may include a mouse 1202, a keyboard 1204, a display 1206, and a printer 1208 as depicted in FIG. 1B. It should be noted that the devices in FIG. 1B are not limited to the I/O device 1106. The I/O device 1106 may include other devices.

In the present exemplary embodiment, the memory storage device 100 is coupled to the other devices/components of the host system 1000 through the data transmission interface 1110. Based on the operations of the microprocessor 1102, the RAM 1104 and the I/O device 1106, the host system 1000 may write data into the memory storage device 100, or the host system 1000 may read data from the memory storage device 100. The memory storage device 100 may be a flash drive 1212, a memory card 1214, or a solid state drive (SSD) 1216, for example, as shown in FIG. 1B.

Figure 1C:
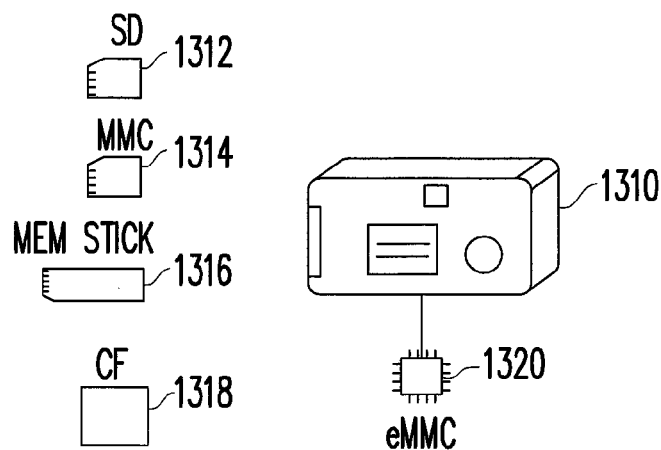
FIG. 1C is a schematic diagram of a host system and a memory storage device according to another exemplary embodiment of the invention.

Generally speaking, the host system 1000 may be any system that can store data. To facilitate description, the present exemplary embodiment takes the host system 1000 as a computer system, for example. However, in another exemplary embodiment of the invention, the host system 1000 may also be a cell phone, a digital camera, a video camera, a communication device, an audio player, or a video player. For example, when the host system is a digital camera 1310, the storage device 100 may be a Secure Digital (SD) card 1312, a Multimedia Card (MMC) 1314, a Memory Stick (MS) 1316, a Compact Flash (CF) card 1318, or an embedded storage device 1320 used by the digital camera 1310, as shown in FIG. 1C. The embedded storage device 1320 includes an embedded multimedia card (eMMC). It should be noted that the eMMC is directly coupled to or disposed on a motherboard of the host system.

Figure 2:
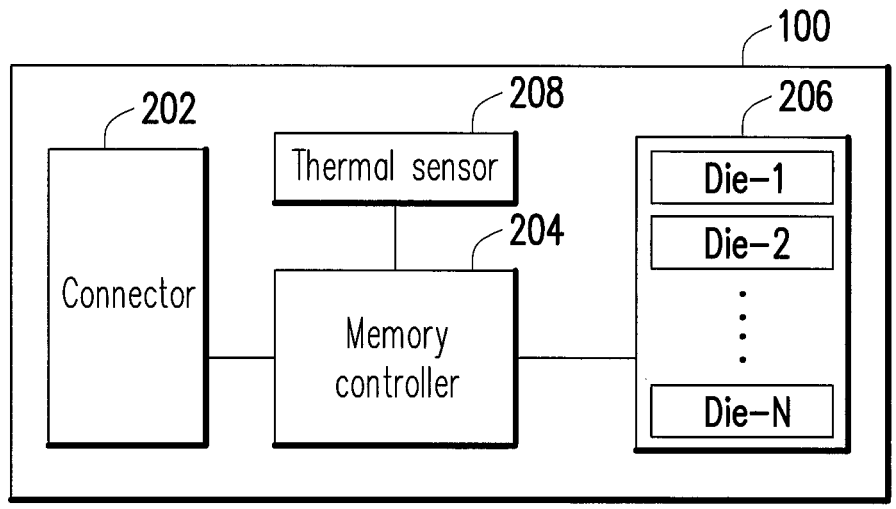
FIG. 2 is a schematic block diagram of the memory storage device depicted in FIG. 1A.

FIG. 2 is a schematic block diagram of the memory storage device depicted in FIG. 1A. Referring to FIG. 2, the memory storage device 100 includes a connector 202, a memory controller 204, a rewritable non-volatile memory module 206, and a thermal sensor 208.

The connector 202 is coupled to the memory controller 204 and configured to couple to the host system 1000. In the present exemplary embodiment, a kind of transmission interface supported by the connector 202 may be a Serial Advanced Technology Attachment (SATA) interface. However, in another exemplary embodiment, the type of the connector 202 may be a Universal Serial Bus (USB) interface, the a MMC interface, a Parallel Advanced Technology Attachment (PATA) interface, an Institute of Electrical and Electronic Engineers (IEEE) 1394 interface, a Peripheral Component Interconnect Express (PCI-E) interface, a SD interface, a MS interface, a CF interface, an Integrated Drive Electronics (IDE) interface, or any suitable interface which is not limited to the above selection.

The memory controller 204 executes a plurality of logic gates or control instructions implemented in a hardware form or a firmware form, and the memory controller 204 performs various data operations such as data writing, reading, and erasing in the rewritable non-volatile memory module 206 according to the host commands from the host system 1000. According to a temperature management method of the present exemplary embodiment, the memory controller 204 is configured for executing a plurality of cooling mechanisms when a hot-spot temperature of the memory storage device 100 reaches a predetermined temperature, and thereby mitigate the heat buildup problem of the (rewritable non-volatile) memory storage device 100. The temperature management method of the present exemplary embodiment is described later with reference to the accompanying drawings.

The rewritable non-volatile memory module 206 is coupled to the memory controller 204 and has a plurality of rewritable non-volatile memory dies DIE-1-DIE-N. Moreover, the rewritable non-volatile memory dies DIE-1-DIE-N may be a plurality of multi level cell (MLC) NAND flash memory dies, although the invention is not limited thereto. The rewritable non-volatile memory dies DIE-1-DIE-N may also be single level cell (SLC) NAND flash memory dies, other flash memory dies, or any other memory dies having the same characteristics.

The thermal sensor 208 is coupled to the memory controller 204 and configured for detecting the hot-spot temperature of the memory storage device 100. In the present exemplary embodiment, the thermal sensor 208 may be disposed in an area of the memory storage device 100 having a highest heat source, such as near the rewritable non-volatile memory module 206, for example, although the invention is not limited thereto.

Figure 3:
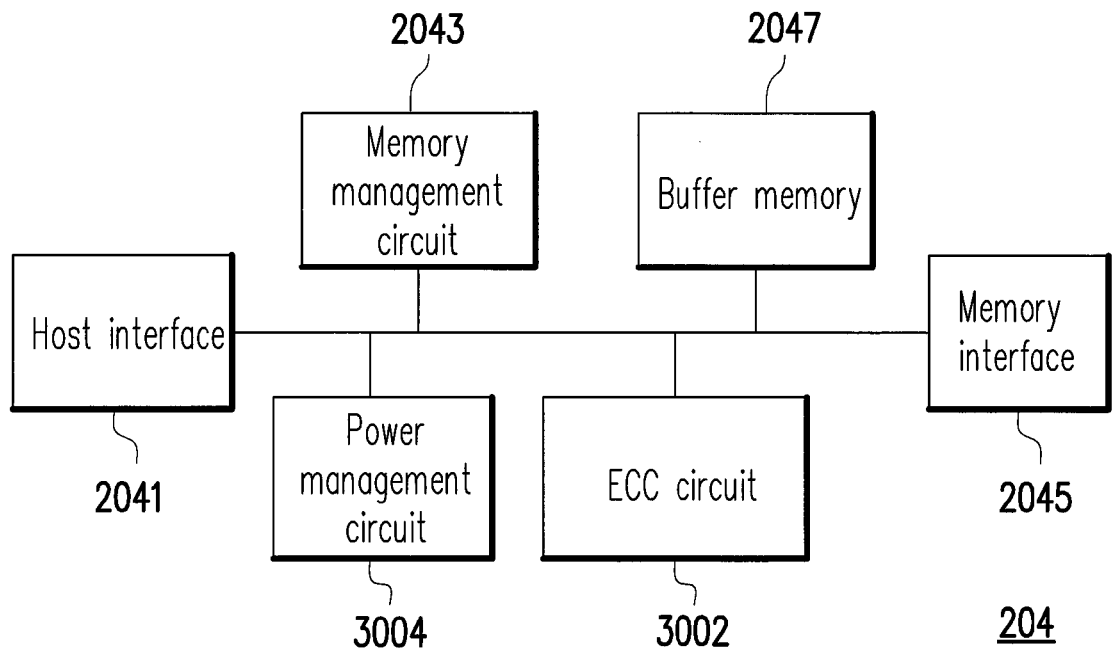
FIG. 3 is a schematic block diagram of a memory controller according to an exemplary embodiment of the invention.

FIG. 3 is a schematic block diagram of the memory controller 204 according to an exemplary embodiment of the invention. Referring FIG. 3, the memory controller 204 includes a host interface 2041, a memory management circuit 2043, a memory interface 2045, and a buffer memory 2047.

The host interface 2041 is coupled to the memory management circuit 2043 and configured to couple to the host system 1000 via the connector 202. The host interface 2041 is used to receive and recognize the commands and data transmitted from the host system 1000. Accordingly, the commands and data from the host system 1000 are transmitted to the memory management circuit 2043 via the host interface 2041. In the present exemplary embodiment, the host interface 2041 corresponds to the connector 202 and is a SATA interface. However, in other exemplarily embodiments, the host interface 2041 may also be a USB interface, an MMC interface, a PATA interface, an IEEE 1394 interface, a PCI-E interface, an SD interface, an MS interface, a CF interface, an IDE interface, or other standardized interfaces.

The memory management circuit 2043 is used to manage/control the overall operation of the memory controller 204. For example, the memory management circuit 2043 groups a plurality of physical blocks in each of the rewritable non-volatile memory dies DIE-1-DIE-N into a plurality of physical units for assess, and records the mapping relationships between the logical access addresses accessed by the host system 1000 and the physical addresses in the physical blocks. In the present exemplary embodiment, the memory management circuit 2043 attributes a corresponding logical unit to map to the physical unit for enabling data access by the host system 1000. Therefore, the memory management circuit must record the constantly updating mapping relationships between the logical units and the physical units (i.e. maintain a logical unit-physical unit mapping table). Moreover, after communicating with the thermal sensor 208, the memory management circuit 2043 can cool the hot-spot temperature of the memory storage device 100 by executing a cooling process when the host-spot temperature is at a predetermined temperature (e.g., the cooling process may be driven or executed by firmware or hardware in the memory storage device 100).

The memory interface 2045 is coupled to the memory management circuit 2043 and configured to couple the memory controller 204 to the rewritable non-volatile memory module 206. Accordingly, the memory controller 204 may execute related operations to the rewritable non-volatile memory module 206. Namely, data to be written into the rewritable non-volatile memory module 206 is converted by the memory interface 2045 into a format acceptable to the rewritable non-volatile memory module 206.

The buffer memory 2047 may be a dynamic random access memory (DRAM) such as a double data rate (DDR) memory, although the invention is not limited thereto. The buffer memory 2047 is coupled to the memory management circuit 2043 and configured to temporarily store data from the host system 1000 or data from the rewritable non-volatile memory module 206.

In another exemplary embodiment of the invention, the memory controller 204 may further include an error checking and correcting circuit 3002. The error checking and correcting circuit 3002 is coupled to the memory management circuit 2043 and configured for executing an error checking and correcting procedure to ensure data accuracy. To be specific, when the memory management circuit 2043 receives a write command from the host system 1000, the error checking and correcting circuit 3002 generates an error checking and correcting (ECC) code for data corresponding to the write command, and the memory management circuit 2043 writes the data corresponding to the write command and the corresponding ECC code into the rewritable non-volatile memory module 206. Subsequently, when the memory management circuit 2043 reads the data from the rewritable non-volatile memory module 206, the memory management circuit 2043 simultaneously reads the corresponding ECC code, and the error checking and correcting circuit 3002 executes the ECC procedure for the read data based on the corresponding ECC code.

In another exemplary embodiment of the invention, the memory controller 204 may further include a power management circuit 3004. The power management circuit 3004 is coupled to the memory management circuit 2043 and configured for controlling the power of the memory storage device 100. It should be apparent that the memory controller 204 may also include other elements/components available to control/manage the rewritable non-volatile memory module 206, and therefore further description thereof is omitted.

Hence, referring back to the Description of the Related Art section, as the volume of the rewritable non-volatile memory becomes smaller and smaller, the heat buildup problem of the rewritable non-volatile memory becomes significant. If no proper heat dissipation measures are adopted to control the overall temperature of the rewritable non-volatile memory device, the rewritable non-volatile memory device becomes prone to data loss due to the heat buildup, and the memory device ages at a fast pace.

Accordingly, in the present exemplary embodiment, the memory management circuit 2043 may communicate with the thermal sensor 208 to know whether the temperature of the rewritable non-volatile memory module 206, an ambient temperature, or an internal temperature of the memory storage device 100 is higher than a predetermined temperature (e.g. a set temperature), in which the temperature detected by the thermal sensor 208 is referred as the hot-spot temperature of the memory storage device 100. For example, the memory management circuit 2043 may communicate with the temperatures sensor 208 after executing a set amount of control commands (e.g., read, write, and erase commands) or within a set amount of time, and thereby become aware of whether the hot-spot temperature of the memory storage device 100 is higher than the set temperature. Alternatively, the thermal sensor 208 may also transmit an interrupt command when the hot-spot temperature of the memory storage device 100 is detected to be higher than the set temperature, so the memory management circuit 2043 is notified that the hot-spot temperature of the memory storage device 100 has become higher than the set temperature. It should be apparent that the memory management circuit 2043 may select to be actively or passively notified of whether the hot-spot temperature of the memory storage device 100 is higher than the set temperature.

Once the memory management circuit 2043 is notified that the hot-spot temperature of the memory storage device 100 is higher than the set temperature (e.g. the predetermined temperature), the memory management circuit 2043 executes the cooling process related to the firmware of the memory storage device 100 when the hot-spot temperature of the memory storage device 100 becomes higher than the set temperature, and thereby reduce the hot-spot temperature of the memory storage device 100. Accordingly, the heat buildup problem of the (rewritable non-volatile) memory storage device 100 can be mitigated, and thereby the data loss and aging problems of the (rewritable non-volatile) memory storage device 100 can also be alleviated.

Specifically, at least the following options are available for the cooling process executed by the memory management circuit 2043:

Lower an internal work frequency of the memory controller 204;

Lower a work frequency for accessing the rewritable non-volatile memory module 206 (i.e. read and write operations);

Lower a total number of the rewritable non-volatile memory dies DIE-1-DIE-N being simultaneously accessed;

Lower a total number of the rewritable non-volatile memory dies DIE-1-DIE-N simultaneously in a busy state, in which the busy state represents that the rewritable non-volatile memory dies DIE-1-DIE-N are currently operating;

Increase an interval time between control commands issued to the rewritable non-volatile memory module 206, namely increasing the interval time between each of commands;

Stop issuing a cache program control command and a cache read control command to the rewritable non-volatile memory module 206; and Enter the buffer memory 2047 (i.e. DRAM) into a self-refresh mode when the rewritable non-volatile memory dies DIE-1-DIE-N are all in the busy state, in which the self-refresh mode refers to a mode that permits a particular system to temporarily suspend the operation of the controller corresponding to the DRAM but not lose data stored in the DRAM, and thereby save power.

In an exemplary embodiment of the invention, lowering the internal work frequency of the memory controller may be implemented in practice by the following schemes, although the invention is not limited to the schemes described hereafter. The internal work frequency of the memory controller 204 is lowered to a first frequency, and after the hot-spot temperature of the memory storage device 100 is reduced to a safe temperature (the safe temperature may not be higher than the predetermined temperature driving the activation of the cooling process), the internal work frequency of the memory controller 204 is restored to a higher original frequency.

To be specific, in another exemplary embodiment of the invention, when the hot-spot temperature of the memory storage device 100 has not been reduced after the internal work frequency of the memory controller 204 has been lowered to the first frequency for a predetermined time (specified by actual design needs/applications), the memory storage device 100 may further lower the internal work frequency of the memory controller 204 from the first frequency to a lower second frequency. Moreover, after the hot-spot temperature is lowered to the safe temperature, the internal work frequency of the memory controller 204 is restored/returned to the original frequency from the second frequency directly or in phases. Conversely (namely, the hot-spot temperature of the memory storage device 100 has been lowered in the predetermined time that the internal work frequency of the memory controller 204 has been lowered), the internal work frequency of the memory controller 204 is restored from the first frequency to the original frequency.

In an exemplary embodiment of the invention, lowering the work frequency for accessing the rewritable non-volatile memory module 206 may be implemented in practice by the following schemes, although the invention is not limited to the schemes described hereafter. The work frequency for accessing the rewritable non-volatile memory module 206 (i.e. an access frequency) is lowered to a first frequency, and after the hot-spot temperature of the memory storage device 100 is reduced to a safe temperature (the safe temperature may not be higher than the predetermined temperature driving the activation of the cooling process), the access frequency is restored to a higher original frequency.

Specifically, in another exemplary embodiment of the invention, when the hot-spot temperature of the memory storage device 100 has not been lowered even when the access frequency has been lowered to the first frequency for a predetermined time (specified by actual design needs/applications), the access frequency from the first frequency is lowered to a lower second frequency from the first frequency. Moreover, after the hot-spot temperature is lowered to the safe temperature, the access frequency is restored/returned to the original frequency from the second frequency directly or in phases. Conversely, the access frequency is restored from the first frequency to the original frequency.

In an exemplary embodiment of the invention, lowering the total number of the rewritable non-volatile memory dies DIE-1-DIE-N being simultaneously accessed may be implemented in practice by the following schemes, although the invention is not limited to the schemes described hereafter. The total number of the rewritable non-volatile memory dies DIE-1-DIE-N being simultaneously accessed (i.e. the total number of dies being simultaneously accessed) is lowered to a first number, and after the hot-spot temperature of the memory storage device 100 is reduced to a safe temperature (the safe temperature may not be higher than the predetermined temperature driving the activation of the cooling process), the total number is restored to a higher original number.

To be specific, in another exemplary embodiment of the invention, when the hot-spot temperature of the memory storage device 100 has not been lowered even when the total number of the dies being simultaneously accessed has been lowered for a predetermined time (specified by actual design needs/applications), the total number of dies being simultaneously accessed is lowered to a lower second number from the first number. Moreover, after the hot-spot temperature is lowered to the safe temperature, the total number of dies being simultaneously accessed is restored/returned to the original number from the second number directly or in phases. Conversely, the total number of dies being simultaneously accessed is restored from the first number to the original number or other greater quantities.

In an exemplary embodiment of the invention, lowering the total number of the rewritable non-volatile memory dies DIE-1-DIE-N simultaneously in the busy state may be implemented in practice by the following schemes, although the invention is not limited to the schemes described hereafter. The total number of the rewritable non-volatile memory dies DIE-1-DIE-N simultaneously in the busy state (i.e. the total number of dies simultaneously in the busy state) is lowered to a first number, and after the hot-spot temperature of the memory storage device 100 is reduced to a safe temperature, the total number of the rewritable non-volatile memory dies DIE-1-DIE-N simultaneously in the busy state is restored to a higher original number.

Specifically, in another exemplary embodiment of the invention, when the hot-spot temperature of the memory storage device 100 has not been lowered even when the total number of dies simultaneously in the busy state has been lowered for a predetermined time (specified by actual design needs/applications), the total number of dies simultaneously in the busy state is lowered to a lower second number from the first number. Moreover, after the hot-spot temperature is lowered to the safe temperature, the total number of the rewritable non-volatile memory dies DIE-1-DIE-N simultaneously in the busy state is restored/returned to the original number from the second number directly or in phases. Conversely, the total number of dies simultaneously in the busy state is restored from the first number to the original number or other greater quantities.

It should be noted that, when the rewritable non-volatile memory die supports cache program and cache read functions, the rewritable non-volatile memory die has two buffers (not drawn), for example a first buffer and a second buffer. When the memory controller transmits the write command to the rewritable non-volatile memory die, a microprocessor unit (MCU) in the rewritable non-volatile memory die receives a write data from the memory controller and temporarily stores the write data in the first buffer. Thereafter, when the memory controller issues the cache program control command, the MCU in the rewritable non-volatile memory die moves the write data temporarily stored in the first buffer into the second buffer, and responds to the memory controller that the write operation is completed. At the same time, the memory controller may again issue a write command to the rewritable non-volatile memory die. In other words, the cache program control command is characterized by allowing the rewritable non-volatile memory die to simultaneously receive a data and another data from the memory controller for writing/programming. In addition, the cache read control command is characterized by directly reading out the data in the rewritable non-volatile memory die to the first buffer, and thereafter transmitting the data to the memory controller. At the same time, the data temporarily stored in the second buffer can be written/programmed.

In the present exemplary embodiment, any type of cooling processes executed by the memory control circuit 2043 can effectively reduce the hot-spot temperature of the memory storage device 100. Moreover, the various types of cooling processes may be executed independently, executed in combination, or even executed one by one according to a set prioritized order in view of actual design requirements. Furthermore, it should be apparent that besides the aforementioned types of cooling processes, other cooling processes executed by the memory controller 204 of the memory storage device 100 also belong to the protective range of the invention. Accordingly, the various types of cooling processes illustrated above are only for exemplifications and should not be used to limit the scope that is claimed in the invention.

Based on the exemplary embodiments described above, FIG. 4 is a flowchart illustrating a temperature management method suitable for a memory storage device having a rewriteable non-volatile memory module according to an exemplary embodiment of the invention. In the present exemplary embodiment, the rewritable non-volatile memory module may include a plurality of rewritable non-volatile memory dies. Moreover, the memory storage device may further include a memory controller used for controlling the rewritable non-volatile memory module, and a sensor used for detecting the hot-spot temperature of the memory storage device. The memory controller has a buffer, and the buffer may be a DRAM or other types of temporary storage memory.

Figure 4:
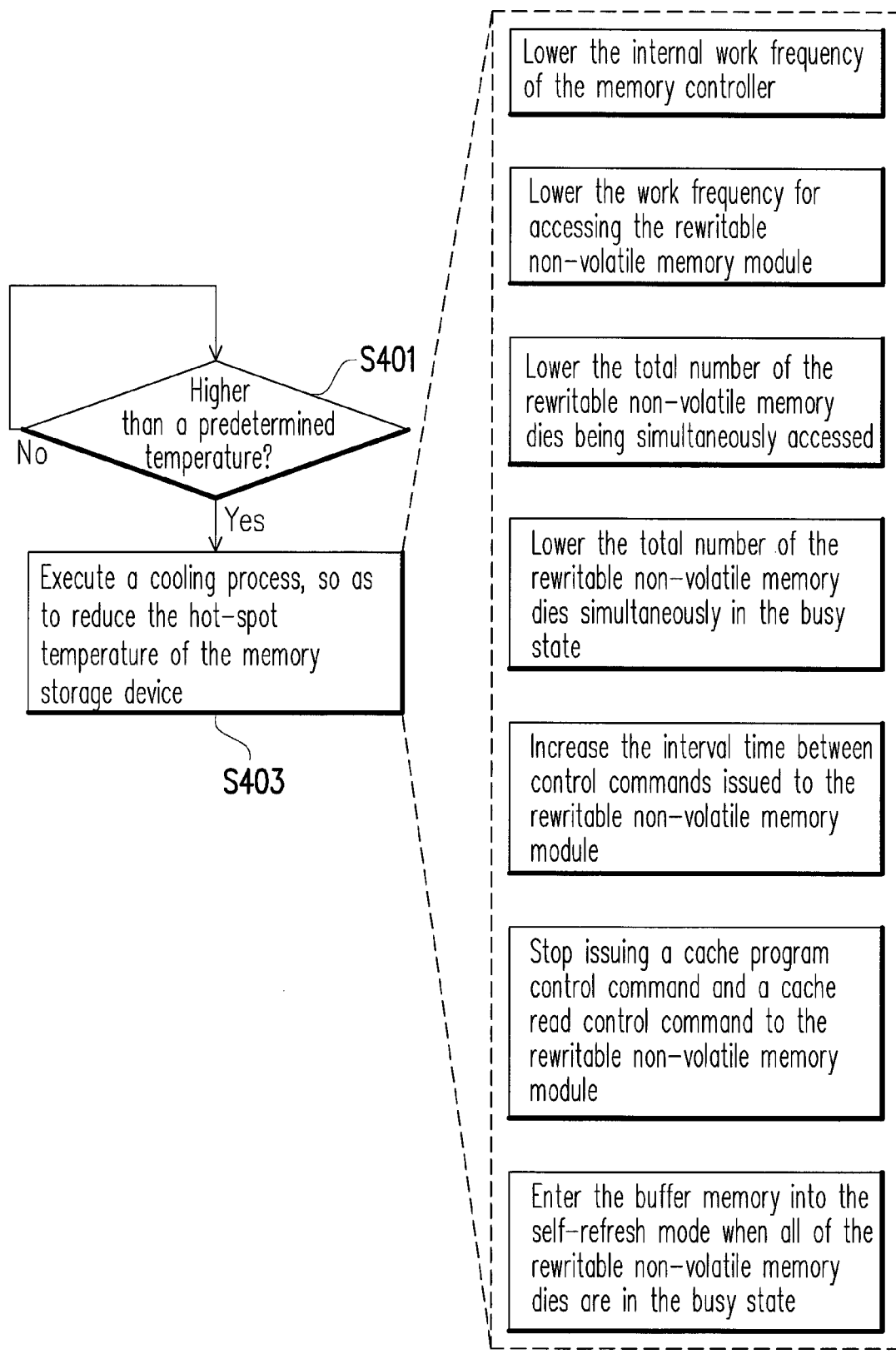
FIG. 4 is a flowchart illustrating a temperature management method suitable for a memory storage device having a rewriteable non-volatile memory module according to an exemplary embodiment of the invention.

Referring to FIG. 4, the temperature management method of the present exemplary embodiments includes:

detecting and determining whether the hot-spot temperature of the memory storage device is higher than a predetermined temperature (Step S401); and when affirmative, making the memory controller 204 execute a cooling process (Step S403), so as to reduce the hot-spot temperature of the memory storage device; otherwise, return to the Step S401 and continue detecting and determining whether the hot-spot temperature of the memory storage device is higher than the predetermined temperature.

The cooling process executed in the Step S403 includes at least one of the following:

Lower the internal work frequency of the memory controller;

Lower the work frequency for accessing the rewritable non-volatile memory module;

Lower the total number of the rewritable non-volatile memory dies being simultaneously accessed;

Lower the total number of the rewritable non-volatile memory dies simultaneously in the busy state;

Increase the interval time between control commands issued to the rewritable non-volatile memory module;

Stop issuing a cache program control command and a cache read control command to the rewritable non-volatile memory module; and Enter the buffer memory into the self-refresh mode when all of the rewritable non-volatile memory dies are in the busy state.

In the present embodiment, implementing the lowering of the internal work frequency of the memory controller, implementing the lowering of the work frequency for accessing the rewritable non-volatile memory module, implementing the reduction of the total number of the rewritable non-volatile memory dies being simultaneously accessed, and implementing the reduction of the total number of the rewritable non-volatile memory dies simultaneously in the busy state in practice may be similar to the afore-described embodiments, and therefore further elaboration thereof is omitted hereafter.

Similarly, any type of cooling processes executed in the Step S403 can effectively reduce the hot-spot temperature of the memory storage device. Moreover, the various types of cooling processes may be executed independently, executed in combination, or even executed one by one according to a set prioritized order in view of actual design requirements.

In view of the foregoing, according to exemplary embodiments of the invention, when the hot-spot temperature of the memory storage device reaches a predetermined temperature, a plurality/single cooling process/mechanism related to the firmware of the memory storage device is executed. Accordingly, the heat buildup problem of the (rewritable non-volatile) memory storage device is mitigated, as well as the problems of data loss and device aging for the (rewritable non-volatile) memory storage device. The previously described exemplary embodiments of the present invention have the advantages aforementioned, wherein the advantages aforementioned not required in all versions of the invention.

What are described above are only embodiments of the invention and do not limit the scope of the invention. Simple and equivalent variations and modifications according to the claims and specification of the invention are still within the scope of the claimed invention. In addition, each of the embodiments and claims does not have to achieve all the advantages or characteristics which are disclosed in the invention. Moreover, the abstract and title only serve to facilitate search of patent documents and are not intended in any way to limit the scope of the claimed invention.

What is claimed is:

1. A temperature management method suitable for a memory storage device having a rewritable non-volatile memory module and a memory controller used for controlling the rewritable non-volatile memory module, wherein the memory controller has a buffer memory comprising a DRAM, and the rewritable non-volatile memory module comprises a plurality of rewritable non-volatile memory dies, the temperature management method comprising:

detecting and determining whether a hot-spot temperature of the rewritable non-volatile memory module is higher than a predetermined temperature; and when affirmative, making the memory controller execute a cooling process, so as to reduce the hot-spot temperature of the rewritable non-volatile memory module, wherein the cooling process comprises at least one of:

lowering a total number of the rewritable non-volatile memory dies being simultaneously accessed, wherein at least one of the rewritable non-volatile memory dies being accessed remains being accessed after the total number of the rewritable non-volatile memory dies being simultaneously accessed is lowered; and lowering a total number of the rewritable non-volatile memory dies that are simultaneously busy, wherein at least one of the rewritable non-volatile memory dies that are busy remains busy after the total number of the rewritable non-volatile memory dies that are simultaneously busy is lowered.

2. The temperature management method as claimed in claim 1, wherein the cooling process comprises:

lowering an internal work frequency of the memory controller to a first frequency; and after the hot-spot temperature of the rewritable non-volatile memory module is reduced to a safe temperature, restoring the work frequency to a higher original frequency.

3. The temperature management method as claimed in claim 1, wherein the cooling process comprises:

lowering a work frequency for accessing the rewritable non-volatile memory module to a first frequency; and after the hot-spot temperature of the rewritable non-volatile memory module is reduced to a safe temperature, restoring the work frequency to a higher original frequency.

4. The temperature management method as claimed in claim 1, wherein the rewritable non-volatile memory module comprises a plurality of rewritable non-volatile memory dies, and the cooling process comprises:

lowering a total number of the rewritable non-volatile memory dies being simultaneously accessed to a first number; and when the hot-spot temperature of the rewritable non-volatile memory module is reduced to a safe temperature after the total number has been lowered to the first number, restoring the total number to a higher original number.

5. The temperature management method as claimed in claim 1, wherein the rewritable non-volatile memory module comprises a plurality of rewritable non-volatile memory dies, and the cooling process comprises:

lowering a total number of the rewritable non-volatile memory dies that are simultaneously busy to a first number wherein a status of simultaneously busy represents that the rewritable non-volatile memory dies are currently operating; and when the hot-spot temperature of the rewritable non-volatile memory module is reduced to a safe temperature after the total number has been lowered to the first number, restoring the total number to a higher original number.

6. The temperature management method as claimed in claim 1, wherein the cooling process comprises:

increasing an interval time between control commands issued to the rewritable non-volatile memory module in an original work frequency.

7. The temperature management method as claimed in claim 1, wherein the cooling process comprises:
  stop issuing a cache program control command and a cache read control command to the rewritable non-volatile memory module.

8. The temperature management method as claimed in claim 1, wherein the cooling process further comprises at least one of:
  lowering an internal work frequency of the memory controller;
  lowering a work frequency for accessing the rewritable non-volatile memory module;
  stop issuing a cache program control command and a cache read control command to the rewritable non-volatile memory module;
  increasing an interval time between control commands issued to the rewritable non-volatile memory module; and
  entering the buffer memory into a self-refresh mode to suspend a controller controlling the DRAM when all of the rewritable non-volatile memory dies are busy.

9. A memory controller used for controlling a rewritable non-volatile memory module of a memory storage device, the memory controller comprising:
  a host interface configured to couple to a host system;
  a memory interface configured to couple to the rewritable non-volatile memory module comprising a plurality of rewritable non-volatile memory dies;
  a memory management circuit coupled to the host interface and the memory interface, and configured to execute a cooling process for reducing a hot-spot temperature of the rewritable non-volatile memory module when the hot-spot temperature of the rewritable non-volatile memory module is higher than a predetermined temperature; and
  a buffer memory coupled to the memory management circuit, and configured to temporarily store data from the host system or data from the rewritable non-volatile memory module, wherein the buffer memory comprises a DRAM;
  wherein the cooling process executed by the memory management circuit comprises at least one of:
    lowering a total number of the rewritable non-volatile memory dies being simultaneously accessed, wherein at least one of the rewritable non-volatile memory dies being accessed remains being accessed after the total number of the rewritable non-volatile memory dies being simultaneously accessed is lowered; and
    lowering a total number of rewritable non-volatile memory dies that are simultaneously busy, wherein at least one of the rewritable non-volatile memory dies that are busy remains busy after the total number of the rewritable non-volatile memory dies that are simultaneously busy is lowered.

10. The memory controller as claimed in claim 9, wherein the cooling process executed by the memory management circuit further comprises:
  lowering an internal work frequency of the memory controller;
  lowering a work frequency for accessing the rewritable non-volatile memory module;
  stop issuing a cache program control command and a cache read control command to the rewritable non-volatile memory module;
  entering the buffer memory into a self-refresh mode to suspend a controller controlling the DRAM when all of the rewritable non-volatile memory dies are busy; and
  increasing an interval time between control commands issued to the rewritable non-volatile memory module.

11. A memory storage device, comprising:
  a connector configured to couple to a host system;
  a rewritable non-volatile memory module comprising a plurality of rewritable non-volatile memory dies;
  a thermal sensor configured to detect a hot-spot temperature of the rewritable non-volatile memory module; and
  a memory controller coupled to the connector, the rewritable non-volatile memory module, and the thermal sensor, and configured to execute a cooling process for reducing the hot-spot temperature of the rewritable non-volatile memory module when the hot-spot temperature of the rewritable non-volatile memory module is higher than a predetermined temperature, wherein the memory controller further comprises:
    a host interface configured to couple to the host system;
    a memory interface configured to couple to the rewritable non-volatile memory module;
    a memory management circuit coupled to the host interface and the memory interface, configured to execute the cooling process for when the hot-spot temperature of the rewritable non-volatile memory module is higher than the predetermined temperature; and
    a buffer memory coupled to the memory management circuit, and configured to temporarily store data from the host system or data from the rewritable non-volatile memory module, the buffer memory comprising a DRAM,
  wherein the cooling process executed by the memory management circuit comprises at least one of:
    lowering a total number of the rewritable non-volatile memory dies being simultaneously accessed, wherein at least one of the rewritable non-volatile memory dies being accessed remains being accessed after the total number of the rewritable non-volatile memory dies being simultaneously accessed is lowered; and
    lowering a total number of rewritable non-volatile memory dies that are simultaneously busy, wherein at least one of the rewritable non-volatile memory dies that are busy remains busy after the total number of the rewritable non-volatile memory dies that are simultaneously busy is lowered.

12. The memory storage device as claimed in claim 11, wherein the cooling process executed by the memory management circuit comprises:
  lowering an internal work frequency of the memory controller to a first frequency; and
  when the hot-spot temperature of the rewritable non-volatile memory module has not been reduced after the work frequency has been lowered to the first frequency for a predetermined time, lowering the work frequency from the first frequency to a lower second frequency; or else, restoring the work frequency from the first frequency to a higher original frequency.

13. The memory storage device as claimed in claim 11, wherein the cooling process executed by the memory management circuit comprises:
  lowering a work frequency for accessing the rewritable non-volatile memory module to a first frequency; and
  when the hot-spot temperature of the rewritable non-volatile memory module has not been reduced after the work frequency has been lowered to the first frequency for a predetermined time, lowering the work frequency from the first frequency to a lower second frequency; or else, restoring the work frequency from the first frequency to a higher original frequency.

14. The memory storage device as claimed in claim 11, wherein the cooling process executed by the memory management circuit comprises:

lowering a total number of the rewritable non-volatile memory dies being simultaneously accessed to a first number; and when the hot-spot temperature of the rewritable non-volatile memory module has not been reduced after the total number has been lowered to the first number for a predetermined time, lowering the total number from the first number to a lower second number; or else, restoring the total number from the first number to a higher original number.

15. The memory storage device as claimed in claim 11, wherein the cooling process executed by the memory management circuit comprises:

lowering a total number of the rewritable non-volatile memory dies that are simultaneously busy to a first number wherein a status of simultaneously busy represents that the rewritable non-volatile memory dies are currently operating; and when the hot-spot temperature of the rewritable non-volatile memory module has not been reduced after the total number has been lowered to the first number for a predetermined time, lowering the total number from the first number to a lower second number; or else, restoring the total number from the first number to a higher original number.

16. The memory storage device as claimed in claim 11, wherein the cooling process executed by the memory management circuit comprises:

increasing an interval time between control commands issued to the rewritable non-volatile memory module in an original work frequency.

17. The memory storage device as claimed in claim 11, wherein the cooling process executed by the memory management circuit comprises:

stop issuing a cache program control command and a cache read control command to the rewritable non-volatile memory module.

18. The memory storage device as claimed in claim 11, wherein the cooling process executed by the memory management circuit further comprises:

lowering an internal work frequency of the memory controller;

lowering a work frequency for accessing the rewritable non-volatile memory module;

stop issuing a cache program control command and a cache read control command to the rewritable non-volatile memory module;

increasing an interval time between control commands issued to the rewritable non-volatile memory module; and entering the buffer memory into a self-refresh mode to suspend a controller controlling the DRAM when all of the rewritable non-volatile memory dies are busy.

\* \* \* \* \*